United States Patent
Stan et al.

(10) Patent No.: US 6,538,471 B1
(45) Date of Patent: Mar. 25, 2003

(54) MULTI-THRESHOLD FLIP-FLOP CIRCUIT HAVING AN OUTSIDE FEEDBACK

(75) Inventors: Mircea Stan, Charlottesville, VA (US); James E. Jasmin, Jeffersonville, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/682,716

(22) Filed: Oct. 10, 2001

(51) Int. Cl.[7] .............................................. H03K 19/173
(52) U.S. Cl. .............................. 326/46; 326/40; 326/93; 326/95
(58) Field of Search .............................. 326/46, 93, 95, 326/113, 40; 327/202, 203, 208–214, 218

(56) References Cited

U.S. PATENT DOCUMENTS

| | | | |
|---|---|---|---|
| 4,182,961 A | * | 1/1980 | Dingwall ..................... 307/225 |
| 4,506,167 A | | 3/1985 | Little et al. |
| 5,081,377 A | * | 1/1992 | Freyman ..................... 307/480 |
| 5,497,114 A | | 3/1996 | Shimozono et al. |
| 6,031,778 A | | 2/2000 | Makino et al. |
| 6,097,230 A | * | 8/2000 | Bareither ..................... 327/202 |

FOREIGN PATENT DOCUMENTS

JP          62-150589          4/1987

* cited by examiner

Primary Examiner—Michael Tokar
Assistant Examiner—Anh Q. Tran
(74) Attorney, Agent, or Firm—Richard A. Henkler; Bracewell & Patterson, L.L.P.

(57) ABSTRACT

A multi-threshold flip-flop circuit having an outside feedback is disclosed. The multi-threshold flip-flop circuit comprises a master latch and a slave latch. Coupled between an output of the slave latch and an input of the master latch, a switchable feedback path is utilized to retain logical values of the slave latch during a sleep mode of the flip-flop circuit.

12 Claims, 2 Drawing Sheets

MULTI-THRESHOLD FLIP-FLOP CIRCUIT HAVING AN OUTSIDE FEEDBACK

BACKGROUND OF THE INVENTION

1. Technical Field

The present invention relates to logic circuits in general, and in particular to flip-flop circuits. Still more particularly, the present invention relates to a multi-threshold flip-flop circuit having an outside feedback.

2. Description of the Prior Art

In order to maintain high performances in electronic devices having a scaled-down power supply voltage, threshold voltages for transistors within the electronic devices need to be scaled down also. However, a lower threshold voltage will give rise to a higher subthreshold leakage current. Especially for battery-powered electronic devices, the relative level of leakage currents increases even more during sleep mode. One solution for reducing the amount of current leakage in sleep mode is to use a circuit commonly known as multi-threshold complementary-metal-oxide semiconductor (MTCMOS) circuit. Generally speaking, a MTCMOS circuit uses low-threshold transistors during active mode but cuts off supply voltage during sleep mode. Such switching scheme works well for combinational circuits but not for sequential circuits because a latch or flip-flop circuit will lose its logical state when the supply voltage is turned off.

Several solutions have been utilized to tackle the problem of losing logical state in MTCMOS sequential circuits. Most of those solutions are generally based on duplicating the regular flip-flop circuit structure with some form of "shadow" or "balloon" latch. A duplicate latch can be built with high-threshold transistors that will keep the logical states of transistors during sleep mode. However, all the prior art solutions typically result in circuits having significant increased complexity with a large chip area overhead. In addition, most prior art solutions have non-trivial issues related to saving and restoring state. Consequently, it would be desirable to provide an improved flip-flop circuit with relatively low subthreshold leakage currents.

BRIEF SUMMARY OF THE INVENTION

In accordance with a preferred embodiment of the present invention, a flip-flop circuit includes a master latch having a forward MTCMOS inverter and a feedback standard inverter, and a slave latch having a forward MTCMOS inverter and a feedback standard inverter. A first switch is connect to an input of the master latch. A second switch is connected between an output of the master latch and an input of the slave latch. A third switch is connected between an output of the slave latch and the input of the master latch.

All objects, features, and advantages of the present invention will become apparent in the following detailed written description.

BRIEF DESCRIPTION OF THE SEVERAL VIEWS OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF THE INVENTION

Detailed Description of a Preferred Embodiment

Figure 1:
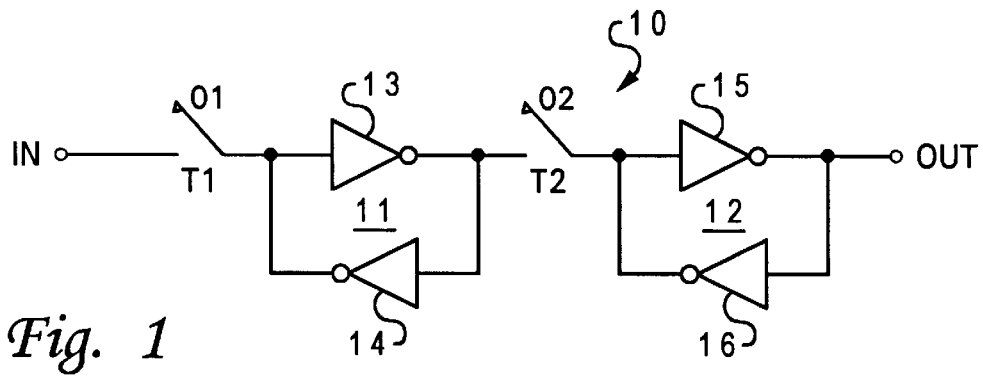
FIG. 1 is a circuit diagram of a typical master-slave flip-flop circuit, according to the prior art.

Referring now to the drawings and in particular to FIG. 1, there is depicted a circuit diagram of a typical master-slave flip-flop circuit, according to the prior art. As shown, a flip-flop circuit 10 includes a master latch 11 and a slave latch 12. Flip-flop circuit 10 has two clock phases, namely, $\ddot{I}\dagger 1$ and $\ddot{I}\dagger 2$. Switches S1 and S2, which can be pass gates or pass transistors, are activated by clock phases $\ddot{I}\dagger 1$ and $\ddot{I}\dagger 2$, respectively. By convention, a switch is closed when the clock is at a logical high (i.e., a logical one), and the switch is opened when the clock is at a logical low (i.e., a logical zero). For flip-flop circuit 10 to function correctly, clock phases $\ddot{I}\dagger 1$ and $\ddot{I}\dagger 2$ need to be non-overlapping (i.e., off-phase with each other). When clock phase $\ddot{I}\dagger 1$ is high, master latch 11 is transparent and slave latch 12 is in store mode during which a data value from a previous clock cycle is being stored. When clock phase $\ddot{I}\dagger 2$ becomes high, master latch 11 is in store mode and slave latch 12 is transparent. Inverters 13–16 used in flip-flop circuit 10 typically have different sizes. For example, the sizes of inverters 13 and 14 are usually larger than the sizes of inverters 15 and 16. The reason that the sizes of inverters 13 and 14 being relatively larger is because the forward path of flip-flop circuit 10 is critical for performance while the feedback path of flip-flop circuit 10 is necessary only for preserving its logical state.

Figure 2:
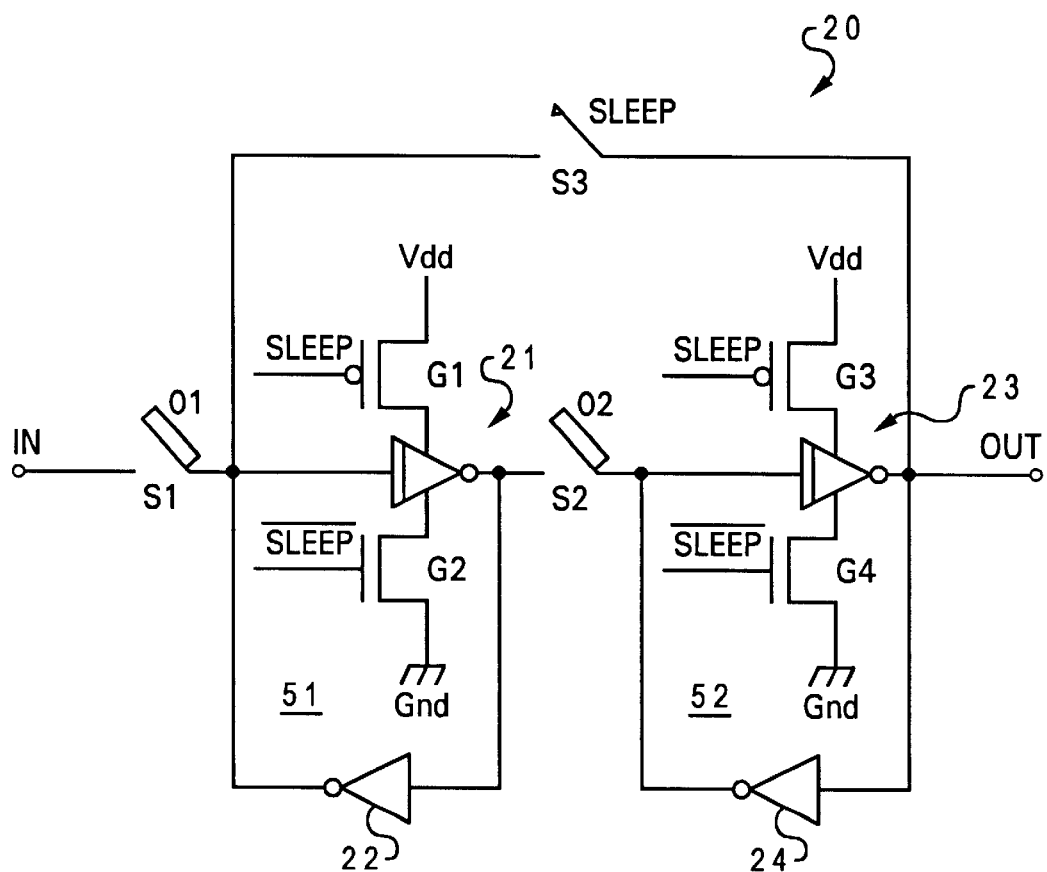
FIG. 2 is a circuit diagram of a master-slave flip-flop circuit, in accordance with a preferred embodiment of the present invention.

With reference now to FIG. 2, there is depicted a circuit diagram of a master-slave flip-flop circuit, in accordance with a preferred embodiment of the present invention. As shown, flip-flop circuit 20 includes a master latch 51 and a slave latch 52. The input of master latch 51 is connected to the input of flip-flop circuit 20 via a first switch S1. The input of slave latch 52 is connected to the output of master latch 51 via a second switch S2. The output of slave latch 52 is connected to the input of master latch 51 via a third switch S3. The output of slave latch 52 is also the output of flip-flop circuit 20. Flip-flop circuit 20 has two clock phasesâ€"$\ddot{I}\dagger 1$ and $\ddot{I}\dagger 2$. First switch S1 and second switch S2, which can be pass gates or pass transistors, are activated by clock phases $\ddot{I}\dagger 1$ and $\ddot{I}\dagger 2$, respectively. Clock phases $\ddot{I}\dagger 1$ and $\ddot{I}\dagger 2$ are non-overlapping. Third switch S3 is activated by a SLEEP signal. A switch is closed when a controlling signal, such as a clock phase or SLEEP signal, is at a logical high (i.e., a logical one), and the switch is opened when the controlling signal is at a logical low (i.e., a logical zero).

Figure 3:
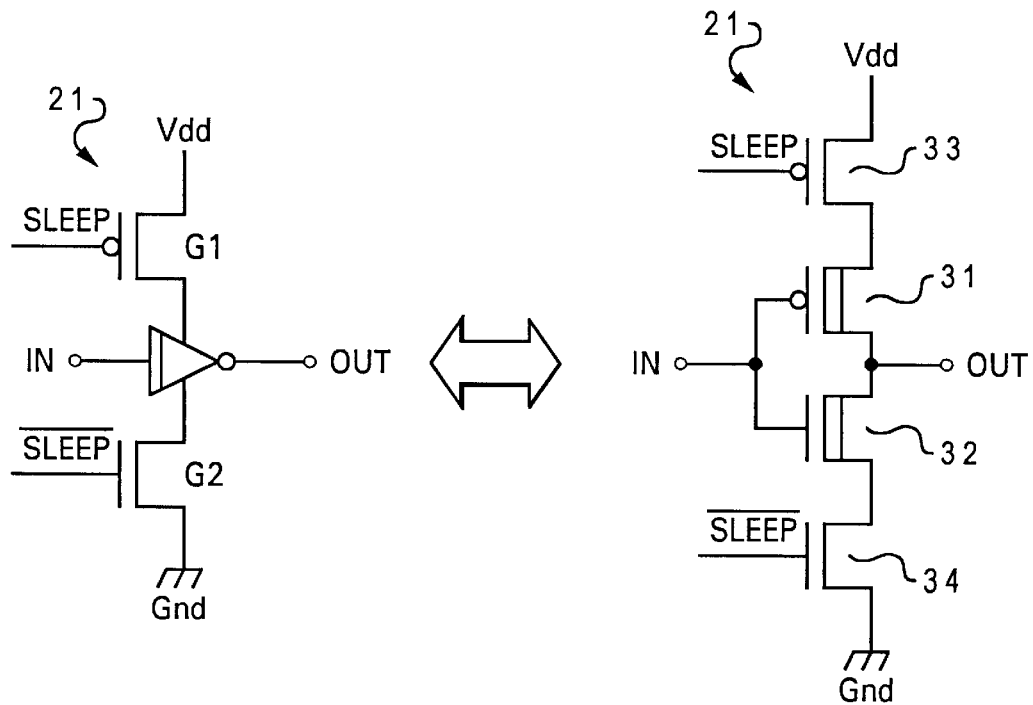
FIG. 3 is a circuit diagram of a MTCMOS inverter within the flip-flop circuit from FIG. 2, in accordance with a preferred embodiment of the present invention.

Master latch 51 is comprised of a multi-threshold complementary-metal-oxide semiconductor (MTCMOS) inverter 21 coupled to a standard inverter 22. Similarly, slave latch 52 is comprised of a MTCMOS inverter 23 coupled to a standard inverter 24. Thus, inverters 21 and 22 forms a first feedback loop, and inverters 23 and 24 forms a second feedback loop. Since MTCMOS inverters 21 and 23 are identical with each other, only MTCMOS inverter 21 will be explained in further details. Referring now to FIG. 3, there is depicted a circuit diagram of MTCMOS inverter 21, in accordance with a preferred embodiment of the present invention. As shown, MTCMOS inverter 21 includes two p-channel transistors 31, 33 connected to two n-channel transistors 32, 34 in series. Transistors 31 and 32 are low-threshold transistors intended for high-speed operations during active mode. Transistors 33 and 34 are high-threshold transistors intended to be utilized as gating transistors for cutting off power supply to transistors 31 and 32 during sleep mode. When the SLEEP signal is asserted, transistors 33 and 34 are turned off such that transistors 31 and 32 are isolated from the power supply.

Figure 4:
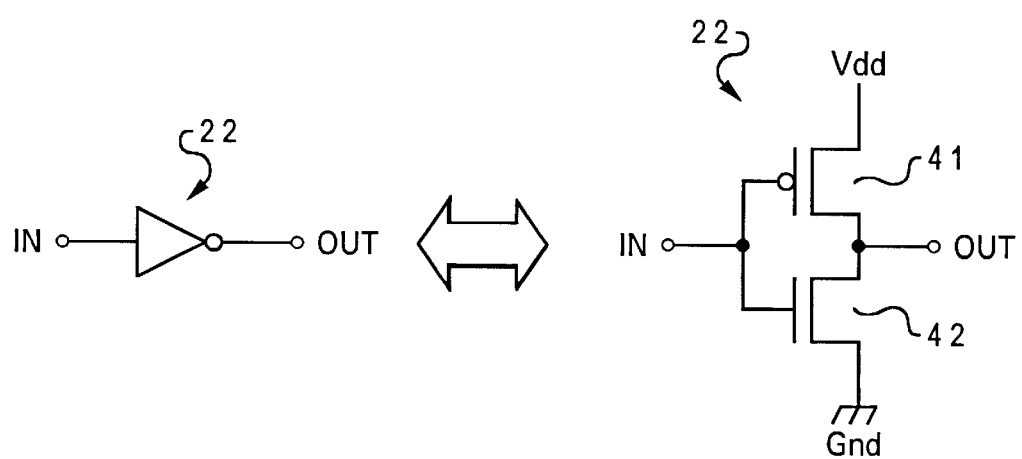
FIG. 4 is a circuit diagram of a standard inverter within the flip-flop circuit from FIG. 2, in accordance with a preferred embodiment of the present invention.

Because standard inverters 22 and 24 are also identical with each other, only standard inverter 22 will be further explained. With reference now to FIG. 4, there is depicted a circuit diagram of standard inverter 22, in accordance with a preferred embodiment of the present invention. As shown, standard inverter 22 includes a p-channel transistor 41 connected to an n-channel transistor 42 in series. The operation of standard inverter 22 is well-known to those skilled in the art.

Flip-flop circuit 20 in FIG. 2 functions as follows. During active mode of operation, the SLEEP signal is de-asserted, which means third switch S3 is open and all gating transistors G1, G2, G3, and G4 are turned on, flip-flop circuit 20 behaves like a regular master-slave flip-flop, similar to flip-flop 10 in FIG. 1. When clock phase it is high during active mode, master latch S1 is transparent and slave latch 52 is in store mode. When clock phase $\ddot{I}\dagger 2$ is high during active mode, master latch 51 is in store mode and slave latch 52 is transparent.

Flip-flop circuit 20 should enter and exit sleep mode when clock phase $\ddot{I}\dagger 1$ is low and clock phase $\ddot{I}\dagger 2$ is high. Clock phase $\ddot{I}\dagger 2$ also needs to remain high during the entire sleep mode. Sleep mode can be entered simply by asserting the SLEEP signal when clock phase $\ddot{I}\dagger 1$ is low and clock phase $\ddot{I}\dagger 2$ is high. The assertion of the SLEEP signal closes third switch S3 and turns off all gating transistors G1, G2, G3, and G4, which effectively shuts off the power supply to MTCMOS inverters 21 and 23. Since MTCMOS inverters 21 and 23 are disconnected from the power supply, the state of flip-flop circuit 20 is now preserved by the loop formed by standard inverter 24, second switch 52, standard inverter 22, and third switch S3. At this point, there is not going to be any major current leakage from any transistors within flip-flop circuit 20 because transistors within standard inverters 22 and 24 are high-threshold transistors, and all low-threshold transistors utilized in MTCMOS inverters 21 and 23 are disconnected from the power supply through high-threshold gating transistors.

Returning to active mode from sleep mode can simply be done by de-asserting the SLEEP signal. The de-asserting of the SLEEP signal will open third switch S3 and turns on all gating transistors, and the logical state of flip-flop circuit 20 will be restored to the logical state before entering sleep mode. It is important to note that closing and opening third switch S3 will not lead to any race condition since the output and the input of master latch 51 are identical (either both high or both low) when clock phase $\ddot{I}\dagger 1$ is low and clock phase $\ddot{I}\dagger 2$ is high as required when entering and exiting sleep mode.

There are several salient features to flip-flop circuit 20. First, only the inverters on the forward path (i.e., inverter 21 and inverter 23) need to be fast and hence be implemented with MTCMOS inverters. Standard inverters 22, 24 and third switch S3 are not in the critical path of flip-flop circuit 20; thus, standard inverters 22, 24 and third switch S3 can be realized with high-threshold transistors for reduced leakage. Second, third switch S3 connects the output to the input of master latch 51, forming an outside feedback. The outside feedback path formed with third switch S3 and the regular high-threshold feedback inverters 22, 24 keeps the logical state of flip-flop circuit 20 during sleep mode. First switch S1 is closed when clock phase $\ddot{I}\dagger 1$ is active, second switch S2 is closed when clock phase $\ddot{I}\dagger 2$ is active, third switch S3 is closed when SLEEP signal is asserted. Third, both switches S1 and S2 are implemented with low-threshold transistors for high speed.

As has been described, the present invention provides a multi-threshold flip-flop circuit having an outside feedback. The flip-flop circuit of the present invention keeps its logical state by using an outside feedback from the output of a slave latch to the input of a master latch. Compared to the prior art flip-flop circuits, the present invention uses a minimal area overhead and has no negative impact on performance.

Although the description of the present invention is related to a master-slave flip-flop structure, it should be understood by those skilled in the art that the concept of the present invention can be applicable to other flip-flop circuits. For example, there may be extra switches on the internal feedbacks for the master and slave latches, or the feedback may have another topology. The outside feedback idea can be applicable to all those cases but a more complex control may be needed to fully close the outside feedback loop. Also, the present invention can also be easily adapted to level sensitive scan design (LSSD) style flip-flop circuits.

While the invention has been particularly shown and described with reference to a preferred embodiment, it will be understood by those skilled in the art that various changes in form and detail may be made therein without departing from the spirit and scope of the invention.

What is claimed is:

1. A flip-flop circuit comprising:
    a master latch having a MTCMOS inverter coupled to a standard inverter;
    a slave latch; and
    a switchable feedback path, coupled between an output of said slave latch and an input of said master latch, for retaining logical values of said slave latch during a sleep mode of said flip-flop circuit.

2. A flip-flop circuit comprising:
    a master latch;
    a slave latch having MTCMOS inverter coupled to a standard inverter; and
    a switchable feedback path, coupled between an output of said slave latch and an input of said master latch, for retaining logical values of said slave latch during a sleep mode of said flip-flop circuit.

3. The flip-flop circuit of claim 1, wherein said MTCMOS inverter further includes a plurality of high-threshold active transistors and a plurality of low-threshold gating transistors.

4. The flip-flop circuit of claim 2, wherein said MTCMOS inverter further includes a plurality of high-threshold active transistors and a plurality of low-threshold gating transistors.

5. A flip-flop circuit comprising:
    a first switch connected to an input of said flip-flop circuit;
    a master latch having a forward MTCMOS inverter and a feedback standard inverter;
    a slave latch having a forward MTCMOS inverter and a feedback standard inverter;
    a second switch connected between an output of said master latch and an input of said slave latch; and a third switch connected between an output of said slave latch and said input of said master latch.

6. The flip-flop circuit of claim 5, wherein said MTCMOS inverter in said master latch further includes low-threshold active transistors and high-threshold gating transistors.

7. The flip-flop circuit of claim 5, wherein said MTCMOS inverter in said slave latch further includes low-threshold active transistors and high-threshold gating transistors.

8. The flip-flop circuit of claim 5, wherein said feedback standard inverter in said master latch further include high-threshold transistors.

9. The flip-flop circuit of claim 5, wherein said feedback standard inverter in said slave latch further include high threshold transistors.

10. The flip-flop circuit of claim 5, wherein said first switch is a low-threshold transistor.

11. The flip-flop circuit of claim 5, wherein said second switch is a low-threshold transistor.

12. The flip-flop circuit of claim 5, wherein said third switch is a high-threshold transistor.

* * * * *